US 8,676,370 B2

(12) United States Patent
Lambert

(10) Patent No.: US 8,676,370 B2
(45) Date of Patent: Mar. 18, 2014

(54) WORKPIECE CARRIER AND WORKPIECE POSITIONING SYSTEM AND METHOD

(75) Inventor: Philip John Lambert, Hauteville Lompnes (FR)

(73) Assignee: DTG International GmbH, Zurich (CH)

( * ) Notice: Subject to any disclaimer, the term of this patent is extended or adjusted under 35 U.S.C. 154(b) by 768 days.

(21) Appl. No.: 12/300,199

(22) PCT Filed: May 10, 2007

(86) PCT No.: PCT/EP2007/004151
§ 371 (c)(1),
(2), (4) Date: Aug. 10, 2011

(87) PCT Pub. No.: WO2007/128585
PCT Pub. Date: Nov. 15, 2007

(65) Prior Publication Data
US 2011/0295414 A1 Dec. 1, 2011

(30) Foreign Application Priority Data
May 10, 2006 (GB) .................................. 0609325.6

(51) Int. Cl.
*G06F 7/00* (2006.01)
(52) U.S. Cl.
USPC .......................... 700/114; 269/66; 198/867.12
(58) Field of Classification Search
USPC ............................... 700/217, 114; 198/867.12
See application file for complete search history.

(56) References Cited

U.S. PATENT DOCUMENTS

| 4,236,301 A | 12/1980 | Hug et al. |
| 4,236,306 A | 12/1980 | Hug et al. |
| 4,598,453 A * | 7/1986 | Wills .............................. 29/271 |
| 4,918,513 A * | 4/1990 | Kurose et al. ................... 439/73 |
| 5,044,615 A * | 9/1991 | Newman et al. ............... 269/231 |

(Continued)

FOREIGN PATENT DOCUMENTS

| DE | 195 34 662 | 9/1997 |
| NL | 7712371 | 8/1978 |
| WO | 91/11898 | 8/1991 |
| WO | 02/089551 | 11/2002 |

OTHER PUBLICATIONS

International Search Report for corresponding application No. PCT/EP2007/004151 mailed May 11, 2007.

*Primary Examiner* — Ramya Burgess
*Assistant Examiner* — Thomas Randazzo
(74) *Attorney, Agent, or Firm* — Renner, Otto, Boisselle & Sklar, LLP

(57) ABSTRACT

A workpiece carrier for supporting a plurality of workpieces, the workpiece carrier comprising a supporting body including a plurality of workpiece support elements, each for supporting a workpiece and providing for individual positioning of the same, the workpiece support elements each including at least one biasing element for applying a biasing force to an edge of the respective workpiece, at least one first cam for acting on an edge of the respective workpiece at a first location against the bias of the at least one biasing element, and at least one second cam for acting on an edge of the respective workpiece at a second location against the bias of the at least one biasing element, wherein the at least one first cam and the at least one second cam are operable such as to enable the position of the respective workpiece to be set relative to the supporting body.

29 Claims, 3 Drawing Sheets

(56) References Cited

U.S. PATENT DOCUMENTS

| | | | |
|---|---|---|---|
| 5,275,326 A | | 1/1994 | Fiedler |
| 5,836,080 A | | 11/1998 | Inagaki et al. |
| 6,003,675 A | * | 12/1999 | Maruyama et al. ........... 206/713 |
| 6,082,547 A | * | 7/2000 | Nentl et al. ................... 206/724 |
| 6,135,854 A | * | 10/2000 | Masumura et al. ............... 451/6 |
| 6,655,535 B2 | * | 12/2003 | Wark et al. .................. 211/41.17 |
| 7,486,522 B2 | * | 2/2009 | Muller et al. .................. 361/737 |
| 2002/0158396 A1 | * | 10/2002 | Bennett et al. ................ 269/309 |
| 2005/0072715 A1 | * | 4/2005 | Pylant et al. .................. 206/706 |
| 2011/0290701 A1 | * | 12/2011 | Bennett et al. ................ 206/725 |

* cited by examiner

WORKPIECE CARRIER AND WORKPIECE POSITIONING SYSTEM AND METHOD

This application is a national phase of International Application No. PCT/EP2007/004151 filed May 10, 2007 and claims priority to UK 0609325.6 filed Oct. 5, 2006 and published in the English language.

The present invention relates to a workpiece carrier for supporting a plurality of workpieces, and a workpiece positioning system for and a method of individually positioning workpieces supported by such a workpiece carrier.

The continuous development of electronics is resulting in more complex systems being contained in smaller components, leading to the use of smaller printed circuit boards. One example is the mobile telephone, where progressively smaller mobile telephones are being developed which have at least the same, if not increased, functionality.

Conventionally, in handling small printed circuit boards, the practice has been to fabricate the printed circuit boards as an array of separable panels in a single, large board, thereby allowing the printed circuit boards to be handled as a single entity. This approach has been used successfully, but the increased accuracy required by the newer, smaller components cannot be achieved by this technique. As a result, such small printed circuit boards have again to be handled separately.

In addition, larger electronic components are being developed as increased functionality is integrated into a single integrated circuit and more than one integrated circuit plus resistors and capacitors are assembled onto a substrate, such as a ball grid array (BGA) substrate or a pin grid array (PGA) substrate, to form a single component. These larger electronic components have also to be handled separately.

For handling such workpieces, workpiece carriers have been developed which allow a plurality of workpieces to be transported simultaneously to a machine, such as a screen printing machine or a placement machine, for operation by the machine. Such workpiece carriers include those manufactured to the JEDEC (Joint Electron Device Engineering Council) standard.

Typically, in the fabrication of an electronic device, a viscous solder paste is first applied to selected areas of a workpiece, such as a substrate, for example, a printed circuit board, through a stencil in a screen printing machine. Electronic components are then placed on the applied solder paste using a placement machine, often referred to as a pick-and-place machine. The workpiece and components are then heated in a re-flow oven to a temperature sufficient to melt the solder paste, causing the solder paste to flow under leads of the components and corresponding pads of the workpiece, thereby forming solder joints and completing the electronic device.

The use of a workpiece carrier enables a plurality of workpieces to be transported simultaneously to a machine, thereby providing for transport efficiencies, but, because the workpieces are only roughly positioned on the workpiece carrier, each workpiece has to be handled individually in operation by the machine in order to establish the position of the supported workpiece. For example, in a screen printing machine, the workpieces are successively supported by a single vacuum tower and the stencil successively positioned by an X-Y table above each workpiece supported by the vacuum tower, with each workpiece, when so positioned, being subject to a separate printing operation. As will be appreciated, such repeated re-positioning of the stencil for each supported workpiece is particularly time consuming, as is the requirement to print each workpiece individually. In a placement machine, for example, the workpieces are successively supported by a single vacuum tower and the robotic pick-and-place arm is re-referenced to the position of the workpiece. Again, such referencing of the pick-and-place robotic arm for each supported workpiece is time consuming.

As disclosed in WO-A-2002/089551, the present applicant has previously developed a tooling fixture which allows for the simultaneous, individual positioning of a plurality of workpieces supported by such mentioned workpiece carriers, thereby enabling a single operation of a machine without any re-positioning or re-referencing. For example, in a screen printing machine, the tooling fixture allows for the printing of a plurality of workpieces in a single printing operation without any re-positioning of the stencil. In a placement machine, for example, the tooling fixture allows for the placement of components on a plurality of workpieces in a single operation without any re-referencing of the pick-and-place robotic arm.

It is an aim of the present invention to provide an improved workpiece carrier which provides for the precise individual pre-positioning of a plurality of workpieces thereon, such that the workpiece carrier can be handled as a single unit without requiring any post-positioning of the workpieces in being subsequently handled by machines.

In one aspect the present invention provides a workpiece carrier for supporting a plurality of workpieces, the workpiece carrier comprising a supporting body including a plurality of workpiece support elements, each for supporting a workpiece and providing for individual positioning of the same, the workpiece support elements each including at least one biasing element for applying a biasing force to an edge of the respective workpiece, at least one first cam for acting on an edge of the respective workpiece at a first location against the bias of the at least one biasing element, and at least one second cam for acting on an edge of the respective workpiece at a second location against the bias of the at least one biasing element, wherein the at least one first cam and the at least one second cam are operable such as to enable the position of the respective workpiece to be set relative to the supporting body.

In one embodiment the at least one biasing element comprises at least one first biasing element for applying a biasing force to an edge of the respective workpiece in a first biasing direction and at least one second biasing element for applying a biasing force to an edge of the respective workpiece in a second biasing direction inclined to the first biasing direction.

Preferably, the first and second biasing directions are substantially orthogonal.

In one embodiment the at least one first cam comprises a single cam.

Preferably, the single first cam is configured such as to act on an edge of the respective workpiece at a location substantially opposite the at least one first biasing element.

In one embodiment the at least one second cam comprises a pair of second cams.

Preferably, the pair of second cams are configured to act on an edge of the respective workpiece at spaced locations to oppose the biasing force of the at least one second biasing element.

In one embodiment the workpieces are substantially rectangular, the at least one biasing element comprises at least one first biasing element configured to apply a biasing force to a first side of the respective workpiece and at least one second biasing element configured to apply a biasing force to a second side, adjacent the first side, of the respective workpiece, the at least one first cam is configured to act on a third side, opposite the first side, of the respective workpiece, and the at least one second cam is configured to act on a fourth side, opposite the second side, of the respective workpiece.

Preferably, the at least one first cam comprises a single cam.

More preferably, the single first cam is configured such as to act substantially at a mid point along the third side of the respective workpiece.

In one embodiment the at least one first biasing element comprises a single biasing element configured to apply a biasing force at substantially a mid point along the first side of the respective workpiece.

Preferably, the at least one second cam comprises a pair of second cams.

More preferably, the pair of second cams are configured to act toward the respective ends of the fourth side of the respective workpiece.

In one embodiment the at least one second biasing element comprises a single biasing element configured to apply a biasing force at substantially a mid point along the second side of the respective workpiece.

In one embodiment each cam comprises a cam member, the cam member including a cam element defining a cam surface which engages an edge of the respective workpiece, and a cam biasing element configured to bias the cam member against the supporting body with sufficient force as to allow for movement of the cam member to set the same in a set position and maintain the cam member in any set position through frictional engagement between the cam member and the supporting body.

Preferably, the cam member is rotatable and includes a tool engagement feature for engaging a tool to enable rotation of the cam member to set the same in a set position.

Preferably, the cam element of the cam member is disposed at a surface of the supporting body and the cam biasing element is configured to bias the cam element of the cam member against the supporting body with sufficient force as to allow for movement of the cam member to set the same in a set position and maintain the cam member in any set position through frictional engagement between the cam element of the cam member and the supporting body.

More preferably, the cam biasing element comprises a resilient element.

Yet more preferably, the cam biasing element comprises a spring washer.

In one embodiment the workpiece support elements each further comprise a recess in which a respective workpiece is supported.

In one embodiment the recess comprises a through aperture which includes a plurality of support members for supporting edges of a respective workpiece.

Preferably, the workpiece comprises a substrate.

In one embodiment the substrate comprises a ball grid array (BGA) substrate.

In another embodiment the substrate comprises a pin grid array (PGA) substrate.

In another aspect the present invention provides a workpiece positioning system for individually positioning workpieces in workpiece carriers as above described, the workpiece positioning system comprising: a workpiece positioning station for individually positioning workpieces located in the workpiece support elements of a workpiece carrier, wherein the workpiece positioning station comprises: a drive assembly for driving the cams of the workpiece support elements of the workpiece carrier such as individually to set the positions of the workpieces; an imaging unit for imaging positions of workpiece referencing features on the workpieces; and a control unit for controlling the drive assembly such as individually to set the positions of the workpieces in response to the imaged positions of the workpiece referencing features.

In one embodiment the drive assembly comprises a plurality of sets of drive units, each being operable to drive the cams of a respective one of the workpiece support elements, and each comprising a plurality of drive units configured to drive the cams of a respective one of the workpiece support elements of the workpiece carrier such as to set the position of the respective workpiece.

In another embodiment the drive assembly comprises a plurality of sets of drive units, at least one of the sets of drive units being movable such as to be operable successively to drive the cams of ones of the workpiece support elements, and each comprising a plurality of drive units configured to drive the cams of a workpiece support element of the workpiece carrier such as to set the position of the workpiece.

In a further embodiment the drive assembly comprises a single set of drive units which are movable such as to be operable successively to drive the cams of each of the workpiece support elements, the set of drive units comprising a plurality of drive units configured to drive the cams of a workpiece support element of the workpiece carrier such as to set the position of the workpiece.

In one embodiment the imaging unit is configured to image positions of workpiece referencing features on the workpieces and workpiece carrier referencing features on the workpiece carrier, and the control unit is configured to control the drive assembly such as individually to set the positions of the workpieces in response to the imaged positions of the respective workpiece referencing features and the workpiece carrier referencing features.

In another embodiment the workpiece carrier has a referencing template mounted thereto for enabling referencing of the positions of the workpieces supported by the workpiece carrier to the workpiece carrier, the imaging unit is configured to image positions of workpiece referencing features on the workpieces and template referencing features on the template, and the control unit is configured to control the drive assembly such as individually to set the positions of the workpieces in response to the imaged positions of the respective workpiece referencing features and the template referencing features.

In one embodiment the imaging unit comprises a single camera.

In another embodiment the imaging unit comprises a plurality of cameras.

Preferably, the workpiece positioning system further comprises: a workpiece placement station for placing workpieces in the workpiece support elements of workpiece carriers.

Preferably, the workpiece placement station comprises: a workpiece store for storing a plurality of workpieces; and a robotic positioner for drawing workpieces from the workpiece store and placing the same in respective ones of the workpiece support elements of workpiece carriers.

Preferably, the workpiece positioning system further comprises: a guide rail assembly along which workpiece carriers are successively transported.

In a further aspect the present invention provides a method for individually positioning workpieces in a workpiece carrier, the method comprising the steps of: successively providing workpiece carriers as above described, where supporting workpieces, to a workpiece positioning station comprising a drive assembly for driving the cams of the workpiece support elements of a workpiece carrier such as individually to set the positions of the workpieces; imaging positions of workpiece referencing features on the workpieces supported by the workpiece carrier; and controlling the drive assembly such as individually to set the positions of the workpieces in response to the imaged positions of the workpiece referencing features.

In one embodiment the drive assembly comprises a plurality of sets of drive units, each being operable to drive the cams of a respective one of the workpiece support elements, and each comprising a plurality of drive units configured to drive the cams of a respective one of the workpiece support elements of the workpiece carrier such as to set the position of the respective workpiece.

In another embodiment the drive assembly comprises a plurality of sets of drive units, at least one of the sets of drive units being movable such as to be operable successively to drive the cams of ones of the workpiece support elements, and each comprising a plurality of drive units configured to drive the cams of a workpiece support element of the workpiece carrier such as to set the position of the workpiece.

In a further embodiment the drive assembly comprises a single set of drive units which are movable such as to be operable successively to drive the cams of each of the workpiece support elements, the set of drive units comprising a plurality of drive units configured to drive the cams of a workpiece support element of the workpiece carrier such as to set the position of the workpiece.

In one embodiment the imaging step comprises the step of: imaging positions of workpiece referencing features on the workpieces and workpiece carrier referencing features on the workpiece carrier; and the controlling step comprises the step of: controlling the drive assembly such as individually to set the positions of the workpieces in response to the imaged positions of the respective workpiece referencing features and the workpiece carrier referencing features.

In another embodiment each workpiece carrier has a referencing template mounted thereto for enabling referencing of the positions of the workpieces supported by the workpiece carrier to the workpiece carrier, the imaging step comprises the step of: imaging positions of workpiece referencing features on the workpieces and template referencing features on the template; and the controlling step comprises the step of: controlling the drive assembly such as individually to set the positions of the workpieces in response to the imaged positions of the respective workpiece referencing features and the template referencing features.

Preferred embodiments of the present invention will now be described hereinbelow by way of example only with reference to the accompanying drawings, in which:

FIG. 1 illustrates a workpiece carrier 3 in accordance with a preferred embodiment of the present invention which provides for the precise individual positioning of a plurality of workpieces 5 as supported thereby, typically to enable operation by a machine, such as a printing, deposition or placement machine.

Figure 1:
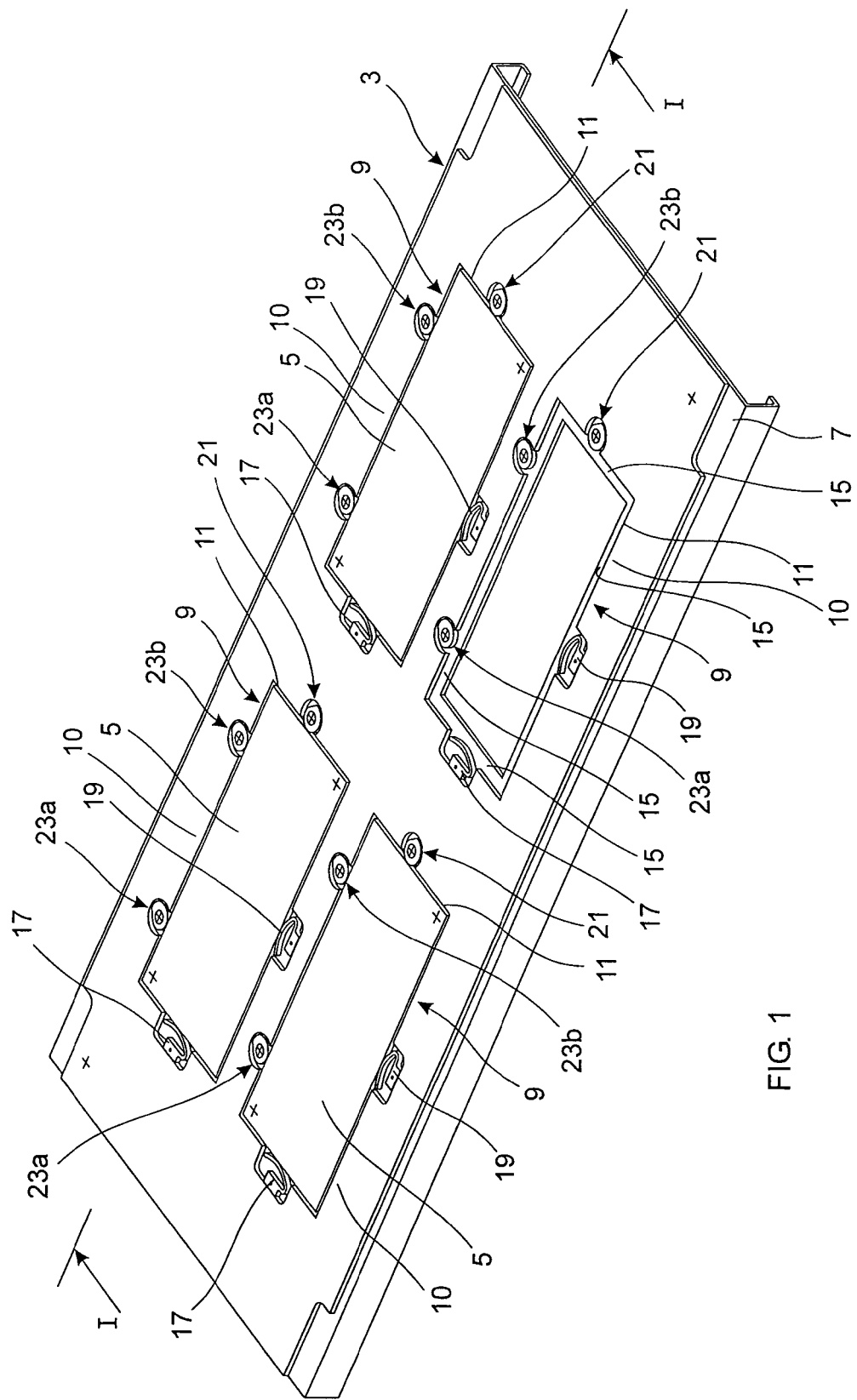
FIG. 1 illustrates a perspective view of a workpiece carrier for supporting a plurality of workpieces in accordance with a preferred embodiment of the present invention, as illustrated partially filled with workpieces.

For the purposes of illustration, the workpiece carrier 3 is illustrated only partially filled with workpieces 5. Examples of workpieces 5 include the bases of packages, such as ball grid array (BGA) and pin grid array (PGA) substrates, which house integrated circuits, such as microprocessors, and substrates, such as printed circuit boards, onto which electronic components are mounted.

The workpiece carrier 3 comprises a plate 7 which includes a plurality of support elements 9, in this embodiment four support elements 9 arranged in pairs in a 2×2 array, for supporting respective ones of the workpieces 5. In other embodiments the workpiece carrier 3 could include any number of support elements 9, which could be arranged in any configuration and have any shape.

The support elements 9 each comprise a workpiece support 10 on which a workpiece 5 is supported. In this embodiment the workpiece support 10 comprises a through aperture 11, here a rectangular aperture, and a plurality of support members 15 which are disposed about the periphery of the aperture 11, here four support members 15 which are located at respective ones of the sides of the aperture 11, for supporting edges of a workpiece 5. In an alternative embodiment the workpiece support 10 could comprise a solid base, which may include a plurality of small apertures for one or both of clearing structures, such as components, on the underside of a workpiece 5 or allowing for the application of a vacuum to the underside of a workpiece 5, such as to prevent the workpiece 5 from being lifted from the workpiece support 10 during operation thereon. The support members 15 of each workpiece support 10 are spaced from the upper surface of the plate 7 such as to define a recess for receiving a workpiece 5, whereby the upper surface of a workpiece 5, when supported by the respective support element 9, is substantially co-planar with the upper surface of the plate 7.

The support elements 9 each further comprise at least one first biasing element 17, in this embodiment a single biasing element 17 disposed substantially at a mid-point along a first side of the respective workpiece 5, which is disposed such as to apply a biasing force to an edge of the respective workpiece 5 in a first biasing direction, at least one second biasing element 19, in this embodiment a single biasing element 19 disposed substantially at a mid-point along a second side of the respective workpiece 5 adjacent the first side thereof, which is disposed such as to apply a biasing force to an edge of the respective workpiece 5 in a second biasing direction which is substantially orthogonal to the first biasing direction, at least one first cam 21, in this embodiment a single first cam 21 disposed substantially at a mid-point along a third side of the respective workpiece 5 opposite to the first side thereof, for acting on the respective workpiece 5 in a direction substantially opposed to the biasing force of the at least one first biasing element 17, and at least one second cam 23, in this embodiment a pair of second cams 23a, 23b disposed toward respective ends of a fourth side of the respective workpiece 5 opposite the second side thereof, for acting on the respective workpiece 5 in a direction substantially opposed to the biasing force of the at least one second biasing element 19.

Figure 3:
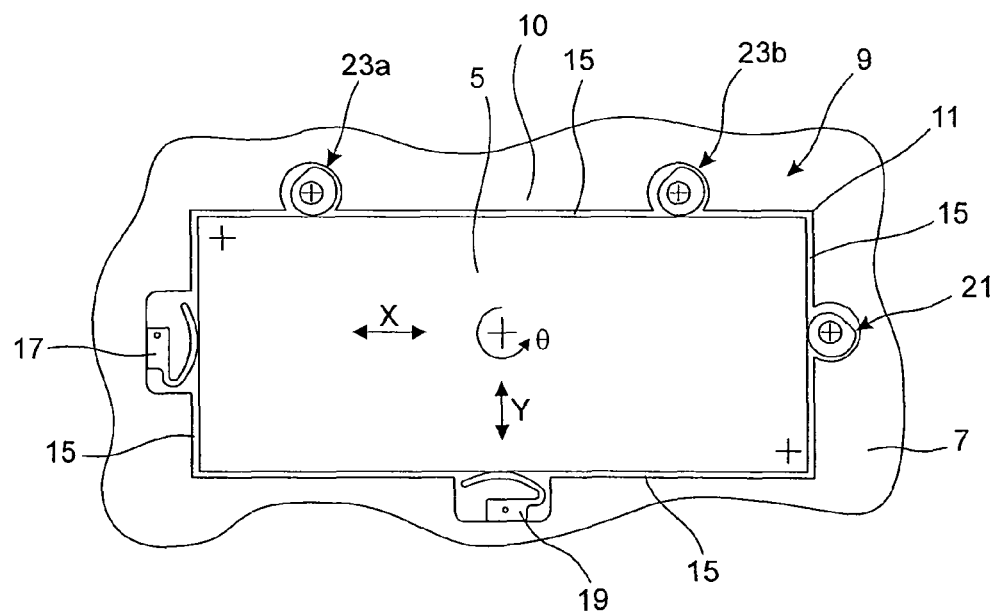
FIG. 3 illustrates in enlarged scale a fragmentary plan view of the workpiece carrier of FIG. 1.

With this configuration, the position of each workpiece 5, both translationally in orthogonal directions x, y and rotationally through an angle θ, can be individually adjusted relative to the workpiece carrier 5 through adjustment of the respective cams 21, 23a, 23b. As illustrated in FIG. 3, the at least one first cam 21 provides for translation of the workpiece 5 in a first direction x, and the at least one second cam 23 provides for translation of the workpiece 5 in a second direction y which is orthogonal to the first direction x. In this way, the translational position of the respective workpiece 5 can be set relative to the workpiece carrier 3. In this embodiment, through the provision of a pair of second cams 23a, 23b which are spaced relative to the second biasing element 19, as illustrated in FIG. 3, the rotational position of the respective workpiece 5 can be set relative to the workpiece carrier 3 through relative adjustment of the pair of second cams 23a, 23b, with the relative adjustment of the pair of second cams 23a, 23b providing inter alia for rotation about the second biasing element 19. As will be appreciated, with rotation of the pair of second cams 23a, 23b to the same amount in opposite directions, rotation is nominally about the center of the workpiece 5.

Figure 2:
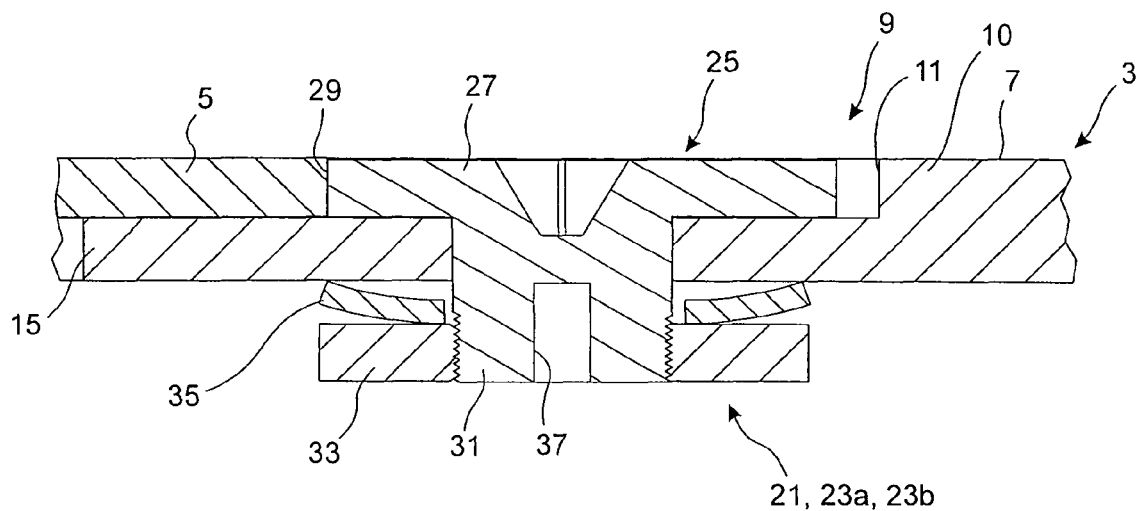
FIG. 2 illustrates in enlarged scale a fragmentary vertical sectional view (along section I-I) through the workpiece carrier of FIG. 1.

As illustrated in FIG. 2, each of the cams 21, 23a, 23b comprises a cam member 25 which includes a cam element 27, which is disposed at the upper surface of the plate 7 adjacent a respective supporting member 15 thereof and defines a cam surface 29 which engages an edge, in this embodiment a respective side, of a workpiece 5, and a cam boss 31 which extends through the plate 7, a retaining element 33, in this embodiment a collar, which is attached to the cam boss 31, and a biasing element 35, in this embodiment a resilient element, here a spring washer, which is configured to bias the cam element 27 of the cam member 25 against the upper surface of the plate 7 with sufficient force as to maintain the cam member 25 in any set position through frictional engagement between the cam element 27 of the cam member 25 and the upper surface of the plate 7 and yet allow for rotation of the cam member 25 in setting the position thereof.

Each of the cam members 25 includes an engagement aperture 37, in this embodiment a slotted recess, for receiving a tool, such as a screwdriver bit or a hex key, to enable rotation of the respective cam members 25 and thereby effect the positioning of the respective workpieces 5. In this embodiment the engagement aperture 37 is located in the cam boss 31 such as to provide for engagement from beneath the workpiece carrier 3. In an alternative embodiment the engagement aperture 37 could be located in the cam element 27 such as to provide for engagement from above the workpiece carrier 3.

In use, a workpiece carrier 3 is loaded with workpieces 5, and the workpieces 5 are each individually positioned by adjustment of the cams 21, 23a, 23b of the respective support elements 9 such that the workpieces 5 are both translationally and rotationally positioned in the required positions relative to the workpiece carrier 3 such as to allow for subsequent operation, as a single unit, by a machine, typically a printing, deposition or placement machine.

In a manual system, the workpieces 5 can be positioned manually by an operator through the use of a template. In this system, a template, which includes template referencing features for referencing the position of the template to the workpiece carrier 3 and workpiece referencing features for referencing the position of each of the workpieces 5 to the template, is first fitted to the upper surface of the workpiece carrier 3 such that the template referencing features are aligned to the counterpart workpiece carrier referencing features on the workpiece carrier 3, and subsequently each of the workpieces 5 are individually positioned by manual adjustment of the cams 21, 23a, 23b of the respective support elements 9 with a hand tool, typically a screwdriver or a hex key, such that the workpiece referencing features are aligned to counterpart workpiece referencing features on the respective workpieces 5.

In an automated system, the workpieces 5 in a workpiece carrier 3 are each positioned automatically using a workpiece positioning system 41.

Figure 4:
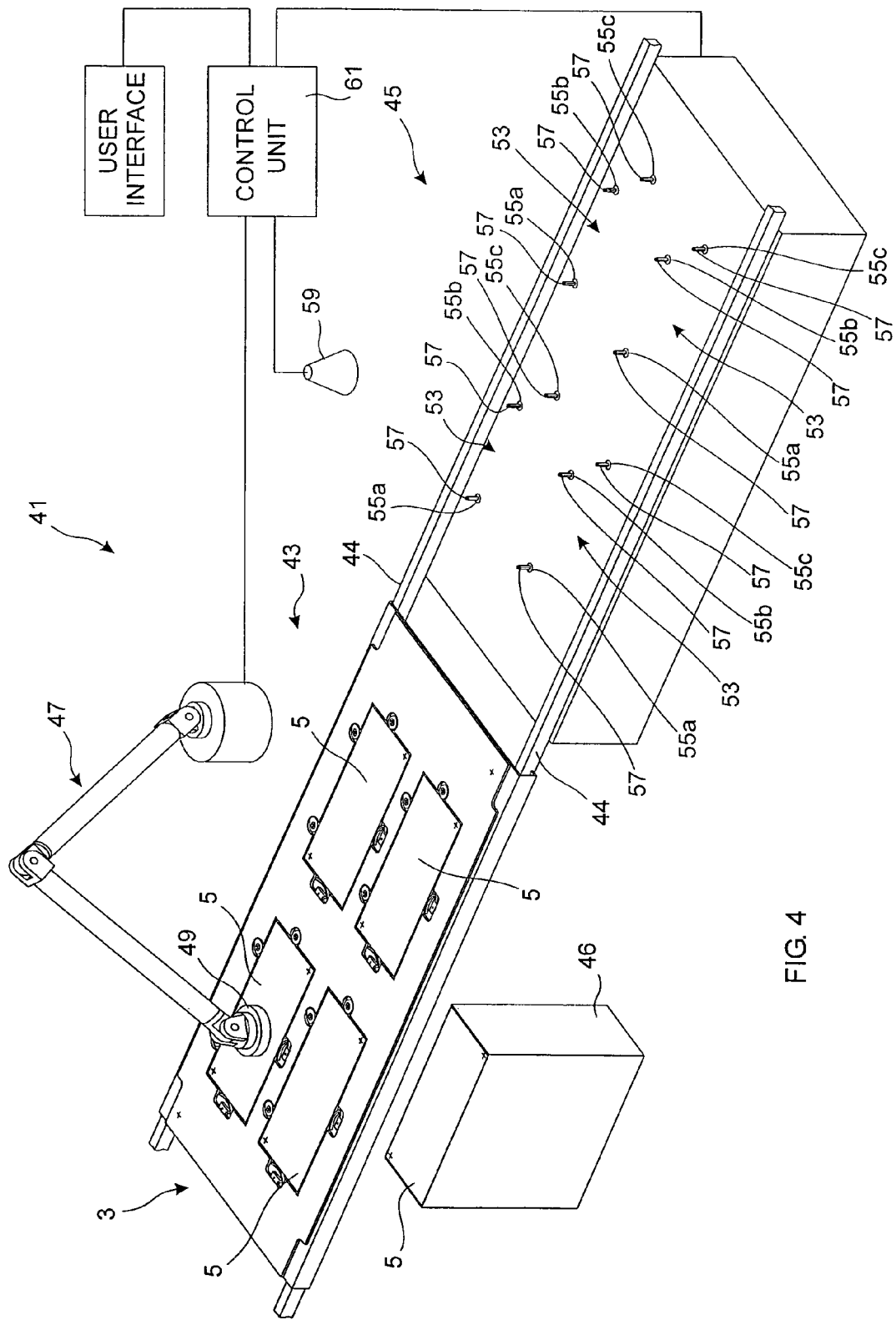
FIG. 4 illustrates a perspective view of a workpiece positioning system for positioning workpieces on a workpiece carrier in accordance with a preferred embodiment of the present invention.

FIG. 4 illustrates a workpiece positioning system 41 for individually positioning workpieces 5 in a workpiece carrier 3 such as to allow for subsequent operation as a single unit.

The workpiece positioning system 41 comprises a workpiece placement station 43 for placing workpieces 5 in each of the support elements 9 in workpiece carriers 3 delivered through the system 41, in this embodiment along a pair of workpiece transfer rails 44, 44, and a workpiece positioning station 45 for individually positioning the placed workpieces 5 in each workpiece carrier 3 such as to allow for each workpiece carrier 3 to be handled subsequently as a single unit.

The workpiece placement station 43 comprises a workpiece store 46 for storing a plurality of workpieces 5, and a robotic arm 47 which includes a holding element 49, in this embodiment a pneumatically-operated suction element, at the distal end thereof, and is operable to draw a workpiece 5 from the workpiece store 46 and place the same in a respective one of the support elements 9 of the workpiece carrier 3.

The workpiece positioning station 45 comprises a plurality of sets of drive units 53, in this embodiment four sets of drive units 53, which each comprise first, second and third drive units 55a, 55b, 55c which are configured such as to engage the cams 21, 23a, 23b of a respective one of the support elements 9 of the workpiece carrier 3 and thereby adjust the cams 21, 23a, 23b such as to set the position of the respective workpiece 5.

In this embodiment the drive units 55a, 55b, 55c each comprise a geared stepper motor and a tool 57 which is configured to engage the engagement member 37 of a respective cam 21, 23a, 23b, in this embodiment by extension thereof to the engagement member 37, and is driven to rotate the cam member 25 of the respective cam 21, 23a, 23b.

The workpiece positioning station 45 further comprises a camera unit 59, in this embodiment a single camera, for imaging the workpiece carrier referencing features on the workpiece carrier 3 and the workpiece referencing features on the workpieces 5. In an alternative embodiment the camera unit 59 could comprise a plurality of cameras for imaging groups of ones or individual ones of the workpiece carrier referencing features on the workpiece carrier 3 and the workpiece referencing features on the workpieces 5. By imaging the workpiece carrier referencing features on the workpiece carrier 3 and the workpiece referencing features on the workpieces 5, the positions of the workpieces 5 relative to the workpiece carrier 3 can be determined, and any positional, either translational or rotational, adjustment of the workpieces 5 can be effected through control of the drive units 55a, 55b, 55c of each of the respective sets of drive units 53, where the required positions of the workpieces 5 relative to the workpiece carrier 3 have previously been learnt by imaging a template.

The system 41 further comprises a control unit 61 for controlling the operation of the workpiece placement station 43, that is, the placement of workpieces 5 by the robotic arm 47, and the workpiece positioning station 45, that is, the drive units 55a, 55b, 55c of each of the respective sets of drive units 53 in response to the imaged positions of the workpiece carrier referencing features on the workpiece carrier 3 and the workpiece referencing features on the workpieces 5.

Finally, it will be understood that the present invention has been described in its preferred embodiments and can be modified in many different ways without departing from the scope of the invention as defined by the appended claims.

For example, the workpiece positioning station 45 could include only a single set of drive units 53 which are movable beneath a workpiece carrier 3 such as successively to engage the cams 21, 23a, 23b of a respective one of the support elements 9 of the workpiece carrier 3 and thereby adjust the cams 21, 23a, 23b such as to set the position of the respective workpiece 5.

In another alternative embodiment, the workpiece positioning station 45, instead of learning the required positions of the workpieces 5 relative to the workpiece carrier 3, can utilize a transparent template which is fitted to the workpiece carrier 3. This template includes template referencing features for referencing the position of the template to the workpiece carrier 5, and workpiece referencing features which are utilized by the control unit 61 to reference the position of each of the workpieces 5 to the template, and hence the workpiece carrier 3. In use, the template is fitted to the upper surface of the workpiece carrier 3 such that the template referencing features are aligned to the counterpart workpiece carrier referencing features on the workpiece carrier 3, and subsequently each of the workpieces 5 are individually positioned by the respective sets of drive units 53 such that the workpiece referencing features on the template are aligned to counterpart workpiece referencing features on the respective workpieces 5.

The invention claimed is:

1. A workpiece carrier for supporting a plurality of workpieces, the workpiece carrier comprising a supporting body including a plurality of workpiece support elements, each for supporting a separate workpiece and providing for individual positioning of the same separately of the other workpieces, the workpiece support elements each including at least one biasing element for applying a biasing force to an outward-facing, external edge of the respective workpiece at a first location, at least one first cam for acting on an outwardly-facing, external edge of the respective workpiece at a second location, separate from the first location, against the bias of the at least one biasing element, and at least one second cam for acting on an outwardly-facing, external edge of the respective workpiece at a third location, separate from the first location, against the bias of the at least one biasing element, wherein the at least one first cam and the at least one second cam are operable to enable the position of the respective workpiece to be set relative to the supporting body.

2. The workpiece carrier of claim 1, wherein the at least one biasing element comprises at least one first biasing element for applying a biasing force to an outwardly-facing, external edge of the respective workpiece in a first biasing direction and at least one second biasing element for applying a biasing force to an outwardly-facing, external edge of the respective workpiece in a second biasing direction inclined to the first biasing direction.

3. The workpiece carrier of claim 1, wherein the at least one first cam comprises a single cam.

4. The workpiece carrier of claim 1, wherein the at least one second cam comprises a pair of second cams.

5. The workpiece carrier of claim 1, wherein the workpieces are substantially rectangular, the at least one biasing element comprises at least one first biasing element configured to apply a biasing force to a first side of the respective workpiece and at least one second biasing element configured to apply a biasing force to a second side, adjacent the first side, of the respective workpiece, the at least one first cam is configured to act on a third side, opposite the first side, of the respective workpiece, and the at least one second cam is configured to act on a fourth side, opposite the second side, of the respective workpiece.

6. The workpiece carrier of claim 5, wherein the at least one first cam comprises a single cam.

7. The workpiece carrier of claim 5, wherein the at least one first biasing element comprises a single biasing element configured to apply a biasing force at substantially a mid point along the first side of the respective workpiece.

8. The workpiece carrier of claim 5, wherein the at least one second cam comprises a pair of second cams.

9. The workpiece carrier of claim 5, wherein the at least one second biasing element comprises a single biasing element configured to apply a biasing force at substantially a mid point along the second side of the respective workpiece.

10. The workpiece carrier of claim 1, wherein each cam comprises a cam member, the cam member including a cam element defining a cam surface which engages an outwardly-facing, external edge of the respective workpiece, and a cam biasing element configured to bias the cam member against the supporting body with sufficient force as to allow for movement of the cam member to set the same in a set position and maintain the cam member in any set position through frictional engagement between the cam member and the supporting body.

11. The workpiece carrier of claim 1, wherein the workpiece support elements each further comprise a recess in which a respective workpiece is supported.

12. The workpiece carrier of claim 1, wherein the workpiece comprises a substrate, optionally the substrate comprises one of a ball grid array (BGA) substrate or a pin grid array (PGA) substrate.

13. A workpiece positioning system for individually positioning workpieces in workpiece carriers, the workpiece carriers each comprising a supporting body including a plurality of workpiece support elements, each for supporting a separate workpiece and providing for individual positioning of the same separately of the other workpieces, the workpiece support elements each including at least one biasing element for applying a biasing force to an outwardly-facing, external edge of the respective workpiece at a first location, at least one first cam for acting on an outwardly-facing, external edge of the respective workpiece at a second location, separate from the first location, against the bias of the at least one biasing element, and at least one second cam for acting on an outwardly-facing, external edge of the respective workpiece at a third location, separate from the first location, against the bias of the at least one biasing element, the at least one first cam and the at least one second cam being operable to enable the position of the respective workpiece to be set relative to the supporting body, wherein the workpiece positioning system comprises:
  a workpiece positioning station for individually positioning workpieces located in the workpiece support elements of a workpiece carrier, wherein the workpiece positioning station comprises:
  a drive assembly for driving the cams of the workpiece support elements of the workpiece carrier individually to set the positions of the workpieces;
  an imaging unit for imaging positions of workpiece referencing features on the workpieces; and
  a control unit for controlling the drive assembly individually to set the positions of the workpieces in response to the imaged positions of the workpiece referencing features.

14. The workpiece positioning system of claim 13, wherein the drive assembly comprises:
  (i) a plurality of sets of drive units, each being operable to drive the cams of a respective one of the workpiece support elements, and each comprising a plurality of drive units configured to drive the cams of a respective one of the workpiece support elements of the workpiece carrier to set the position of the respective workpiece; or
  (ii) a plurality of sets of drive units, at least one of the sets of drive units being movable to be operable successively to drive the cams of ones of the workpiece support elements, and each comprising a plurality of drive units configured to drive the cams of a workpiece support element of the workpiece carrier to set the position of the workpiece; or (iii) a single set of drive units which are movable to be operable successively to drive the cams of each of the workpiece support elements, the set of drive units comprising a plurality of drive units configured to drive the cams of a workpiece support element of the workpiece carrier to set the position of the workpiece.

15. The workpiece positioning system of claim 13, wherein the imaging unit is configured to image positions of workpiece referencing features on the workpieces and workpiece carrier referencing features on the workpiece carrier, and the control unit is configured to control the drive assembly individually to set the positions of the workpieces in response to the imaged positions of the respective workpiece referencing features and the workpiece carrier referencing features.

16. The workpiece positioning system of claim 13, wherein the workpiece carrier has a referencing template mounted thereto for enabling referencing of the positions of the workpieces supported by the workpiece carrier to the workpiece carrier, the imaging unit is configured to image positions of workpiece referencing features on the workpieces and template referencing features on the template, and the control unit is configured to control the drive assembly individually to set the positions of the workpieces in response to the imaged positions of the respective workpiece referencing features and the template referencing features.

17. The workpiece positioning system of claim 13, wherein the imaging unit comprises a single camera or a plurality of cameras.

18. The workpiece positioning system of claim 13, further comprising:
a workpiece placement station for placing workpieces in the workpiece support elements of workpiece carriers, optionally the workpiece placement station comprises a workpiece store for storing a plurality of workpieces, and a robotic positioner for drawing workpieces from the workpiece store and placing the same in respective ones of the workpiece support elements of workpiece carriers.

19. The workpiece positioning system of claim 13, further comprising:
a guide rail assembly along which workpiece carriers are successively transported.

20. A method for individually positioning workpieces in a workpiece carrier, the method comprising the steps of:
successively providing workpiece carriers, the workpiece carriers each comprising a supporting body including a plurality of workpiece support elements, each supporting a separate workpiece and providing for individual positioning of the same separately of the other workpieces, the workpiece support elements each including at least one biasing element applying a biasing force to an outwardly-facing, external edge of the respective workpiece at a first location, at least one first cam acting on an outwardly-facing, external edge of the respective workpiece at a second location, separate from the first location, against the bias of the at least one biasing element, and at least one second cam acting on an outwardly-facing, external edge of the respective workpiece at a third location, separate from the first location, against the bias of the at least one biasing element, the at least one first cam and the at least one second cam being operable to enable the position of the respective workpiece to be set relative to the supporting body, where supporting workpieces, to a workpiece positioning station comprising a drive assembly for driving the cams of the workpiece support elements of a workpiece carrier individually to set the positions of the workpieces;
imaging positions of workpiece referencing features on the workpieces supported by the workpiece carrier; and
controlling the drive assembly individually to set the positions of the workpieces in response to the imaged positions of the workpiece referencing features.

21. The method of claim 20, wherein the drive assembly comprises:
(i) a plurality of sets of drive units, each being operable to drive the cams of a respective one of the workpiece support elements, and each comprising a plurality of drive units configured to drive the cams of a respective one of the workpiece support elements of the workpiece carrier to set the position of the respective workpiece; or
(ii) a plurality of sets of drive units, at least one of the sets of drive units being movable to be operable successively to drive the cams of ones of the workpiece support elements, and each comprising a plurality of drive units configured to drive the cams of a workpiece support element of the workpiece carrier to set the position of the workpiece; or
(iii) a single set of drive units which are movable to be operable successively to drive the cams of each of the workpiece support elements, the set of drive units comprising a plurality of drive units configured to drive the cams of a workpiece support element of the workpiece carrier to set the position of the workpiece.

22. The method of claim 20, wherein the imaging step comprises the step of:
imaging positions of workpiece referencing features on the workpieces and workpiece carrier referencing features on the workpiece carrier;
and the controlling step comprises the step of:
controlling the drive assembly individually to set the positions of the workpieces in response to the imaged positions of the respective workpiece referencing features and the workpiece carrier referencing features.

23. The method of claim 20, wherein each workpiece carrier has a referencing template mounted thereto for enabling referencing of the positions of the workpieces supported by the workpiece carrier to the workpiece carrier, the imaging step comprises the step of:
imaging positions of workpiece referencing features on the workpieces and template referencing features on the template;
and the controlling step comprises the step of:
controlling the drive assembly individually to set the positions of the workpieces in response to the imaged positions of the respective workpiece referencing features and the template referencing features.

24. The workpiece carrier of claim 1, wherein the first and second biasing directions are substantially orthogonal.

25. The workpiece carrier of claim 3, wherein the at least one biasing element comprises at least one first biasing element for applying a biasing force to an outwardly-facing, external edge of the respective workpiece in a first biasing direction and at least one second biasing element for applying a biasing force to an outwardly-facing, external edge of the respective workpiece in a second biasing direction inclined to the first biasing direction, wherein the single first cam is configured to act on an outwardly-facing, external edge of the respective workpiece at a location substantially opposite the first location of the at least one first biasing element.

26. The workpiece carrier of claim 4, wherein the at least one biasing element comprises at least one first biasing element for applying a biasing force to an outwardly-facing, external edge of the respective workpiece in a first biasing direction and at least one second biasing element for applying a biasing force to an outwardly-facing, external edge of the respective workpiece in a second biasing direction inclined to the first biasing direction, wherein the pair of second cams are configured to act on an outwardly-facing, external edge of the respective workpiece at spaced locations to oppose the biasing force of the at least one second biasing element.

27. The workpiece carrier of claim 6, wherein the single first cam is configured to act substantially at a mid point along the third side of the respective workpiece.

28. The workpiece carrier of claim 8, wherein the pair of second cams are configured to act toward the respective ends of the fourth side of the respective workpiece.

29. The workpiece carrier of claim 10, wherein the cam member is rotatable and includes a tool engagement feature for engaging a tool to enable rotation of the cam member to set the same in a set position, optionally the cam element of the cam member is disposed at a surface of the supporting body and the cam biasing element is configured to bias the cam element of the cam member against the supporting body with sufficient force as to allow for movement of the cam member to set the same in a set position and maintain the cam member in any set position through frictional engagement between the cam element of the cam member and the supporting body, optionally the cam biasing element comprises a resilient element, and optionally the cam biasing element comprises a spring washer.

\* \* \* \* \*

UNITED STATES PATENT AND TRADEMARK OFFICE
CERTIFICATE OF CORRECTION

PATENT NO.       : 8,676,370 B2
APPLICATION NO. : 12/300199
DATED            : March 18, 2014
INVENTOR(S)      : Philip John Lambert It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1438 days.

Signed and Sealed this

Twenty-ninth Day of September, 2015

Michelle K. Lee
*Director of the United States Patent and Trademark Office*